United States Patent
Fasoli

(10) Patent No.: US 7,420,851 B2
(45) Date of Patent: *Sep. 2, 2008

(54) MEMORY DEVICE FOR CONTROLLING CURRENT DURING PROGRAMMING OF MEMORY CELLS

(75) Inventor: Luca G. Fasoli, San Jose, CA (US)

(73) Assignee: San Disk 3D LLC, Milpitas, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 11/552,472

(22) Filed: Oct. 24, 2006

(65) Prior Publication Data

US 2008/0094916 A1   Apr. 24, 2008

(51) Int. Cl.
*G11C 16/00* (2006.01)

(52) U.S. Cl. .................. 365/185.25; 365/203

(58) Field of Classification Search ............. 365/185.25
See application file for complete search history.

(56) References Cited

U.S. PATENT DOCUMENTS

| | | | | |
|---|---|---|---|---|
| 4,715,014 | A | * | 12/1987 | Tuvell et al. ............ 365/185.28 |
| 4,858,194 | A | * | 8/1989 | Terada et al. ............ 365/185.25 |
| 5,172,338 | A | | 12/1992 | Mehrotra et al. |
| 5,991,517 | A | | 11/1999 | Harari et al. |
| 6,034,882 | A | | 3/2000 | Johnson et al. |
| 6,301,158 | B1 | * | 10/2001 | Iwahashi ............... 365/185.23 |
| 6,567,314 | B1 | | 5/2003 | Ogura et al. |
| 6,574,145 | B2 | | 6/2003 | Kleveland et al. |
| 6,614,691 | B2 | * | 9/2003 | Roohparvar ........... 365/185.23 |
| 6,731,542 | B1 | | 5/2004 | Le et al. |
| 6,891,748 | B2 | | 5/2005 | Tsuchida et al. |
| 7,206,232 | B2 | * | 4/2007 | Kurosaki et al. ....... 365/185.25 |
| 2002/0114192 | A1 | | 8/2002 | Takase et al. |
| 2004/0232509 | A1 | | 11/2004 | Vyvoda |
| 2005/0117399 | A1 | * | 6/2005 | Kwon et al. ........... 365/185.28 |
| 2005/0121742 | A1 | | 6/2005 | Petti et al. |
| 2005/0226067 | A1 | | 10/2005 | Herner et al. |
| 2005/0232012 | A1 | | 10/2005 | Park |
| 2006/0067117 | A1 | | 3/2006 | Petti et al. |
| 2006/0139994 | A1 | | 6/2006 | Bill et al. |

OTHER PUBLICATIONS

Baek et al., "Highly Scalable Non-volatile Resistive Memory using Simple Binary Oxide Driven by Asymmetric Unipolar Voltage Pulses", IEDM 04, 2004, pp. 587-590.
Baek et al., "Multi-layer Cross-point binary Oxide Resistive Memory (OxRRAM) for Post-NAND Storage Application", IEEE 0-7803-9269, 2005.
Hwang et al., "Writing Current Reduction for High-density Phase-change RAM", IEDM 03, IEEE 0-7803-7872, 2003, pp. 893-896.

(Continued)

*Primary Examiner*—Tan T. Nguyen

(57) ABSTRACT

Improved circuitry and methods for programming memory cells of a memory device are disclosed. The improved circuitry and methods operate to isolate the memory cells from potentially damaging electrical energy that can be imposed during a precharge phase that precedes programming of the memory cells. Additionally, the improved circuitry and methods can operate to ensure that programming of the memory cells is performed in a controlled manner using only a program current. The improved circuitry and methods are particularly useful for programming non-volatile memory cells. In one embodiment, the memory device pertains to a semiconductor memory product, such as a semiconductor memory chip or a portable memory card.

20 Claims, 5 Drawing Sheets

OTHER PUBLICATIONS

Johnson et al., "512-Mb PROM With a Three-Dimensional Array of Diode/Antifuse Memory Cells", IEEE J. of Solid-State Curcuitry, vol. 38, No. 11, Nov. 2003, pp. 1920-1928.

Pirovano et al., "Electronic Switching in Phase-Change Memories", IEEE Transations on Electronic Devices, vol. 51, No. 3, Mar. 2004, 452-459.

Bandyopadhyay et al., "Vertical p-i-n Polysilicon Diode with Antifuse for Stackable Field-Programmable ROM", IEEE Electron Device Letters, vol. 25, No. 5, May 5, 2004, pp. 271-273.

International Search Report and Written Opinion for PCT/US2007/081936 dated Mar. 6, 2008.

U.S. Appl. No. 11/552,462 entitled "Method for Controlling Current During Programming of Memory Cells", filed Oct. 24, 2006.

* cited by examiner

MEMORY DEVICE FOR CONTROLLING CURRENT DURING PROGRAMMING OF MEMORY CELLS

CROSS-REFERENCE TO RELATED APPLICATION

This application is related to U.S. application Ser. No. 11/552,462, filed concurrently herewith, and entitled "METHOD FOR CONTROLLING CURRENT DURING PROGRAMMING OF MEMORY CELLS," which is hereby incorporated herein by reference.

BACKGROUND OF THE INVENTION

1. Field of the Invention

The invention relates to memory devices and, more particularly, to programming non-volatile memory devices.

2. Description of the Related Art

Memory devices that provide persistent data storage use non-volatile memory cells. The memory devices can typically be implemented by semiconductor chips. The semiconductor chips can be used internal to electronic systems or can be used within memory cards that can be removably attached to electronic systems. Memory cards are commonly used to store digital data for use with various products (e.g., electronic products). Memory cards often use Flash type or EEPROM type memory cells to store the data. Memory cards have a relatively small form factor and have been used to store digital data for electronic products (e.g., portable consumer electronic products). A major supplier of memory cards is SanDisk Corporation of Sunnyvale, Calif.

Several methods are known for programming non-volatile memory cells. One method applies a programming pulse of a sufficiently long duration to program a memory cell. In order to guarantee that every memory cell is able to be programmed using this method, programming time and power are set for worst-case conditions. Accordingly, this "over-provisioning" approach can result in excessive average programming time and power. In another method, a series of short, high-voltage programming pulses is applied to a memory cell. After each programming pulse, a nominal-voltage reading pulse is applied to determine whether the memory cell is in a programmed state. If the memory cell is in a programmed state, no further programming pulses are applied. Otherwise, an additional programming pulse is applied, and the sequence of reading and programming continues until the memory cell is eventually in a programmed state. One disadvantage of this approach is the time and power overhead associated with switching between program and read voltages. Another disadvantage of this approach is that the use of short programming pulses (as compared to a long, continuous programming pulse) tends to be less energy efficient.

More recently, a method for programming non-volatile memory cells made use of detection circuits. While a particular memory cell is being programmed, a detection circuit determines whether the memory cell is in a programmed state. Once the memory cell is detected to have reached the programmed state, the programming of the memory cell is terminated. Additional details on this method for programming are provided in U.S. Pat. No. 6,574,145.

Conventionally, non-volatile memory cells require careful control of the current used during a programming operation. One type of non-volatile memory cell is a diode-based non-volatile memory cell which utilizes an antifuse structure. During programming, the antifuse structure is "popped" or "blown" during a program (or write) event. However, the characteristics of such memory cells are that the current utilized to program the memory cells is directly related to the final read current on a read event. Hence, accurate control over the program (or write) current is needed in order to later properly read data from the memory cell. This is particularly true for memory cells that are programmed to utilize more than two levels, such as multi-level data storage (e.g., multi-bit data storage). With multi-level data storage, more than two distinct levels of current are needed during programming of a single memory cell. As more levels of current are needed, the accuracy of the control over the program current becomes even more important.

Thus, there is a need for improved approaches to controlling currents supplied to memory cells during program operations.

SUMMARY OF THE INVENTION

The invention relates to improved circuitry and methods for programming memory cells of a memory device. The improved circuitry and methods operate to isolate the memory cells from potentially damaging electrical energy that can be imposed during a precharge phase that precedes programming of the memory cells. Additionally, the improved circuitry and methods can operate to ensure that programming of the memory cells is performed in a controlled manner using only a program current.

The improved circuitry and methods are particularly useful for programming non-volatile memory cells. In one embodiment, the memory device pertains to a semiconductor memory product, such as a semiconductor memory chip or a portable memory card.

The invention can be implemented in numerous ways, including as a method, system, device or apparatus. Several embodiments of the invention are discussed below.

As a memory device, one embodiment of the invention includes at least a memory array and a program control circuit. The memory array includes a plurality of memory cells. The program control circuit is operative to apply a precharge current to precharge a conductive line used to program a memory cell while the memory cell is isolated from the conductive line. After precharge of the conductive line, the program control circuit operates to apply a program current to the conductive line so as to program the memory cell. The programming of the memory cell is thus performed in accordance with the program current, whereas the precharge of the conductive line is performed in accordance with the precharge current. The precharge current is, therefore, able to safely be greater than the program current.

As an electronic system, one embodiment of the invention includes at least a data acquisition device and a data storage device. The data storage device is removably coupled to the data acquisition device and capable of storing data acquired by the data acquisition device. The data storage device includes at least a memory array and a program control circuit. The memory array includes a plurality of data storage elements. The program control circuit is operative to apply a precharge current to precharge a conductive line used to program a data storage element while the data storage element is isolated from the conductive line. After precharge of the conductive line, the program control circuit operates to apply a program current to the conductive line so as to program the data storage element. The programming of the data storage element is thus performed in accordance with the program current, whereas the precharge of the conductive line is performed in accordance with the precharge current.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to improved circuitry and methods for programming memory cells of a memory device. The improved circuitry and methods operate to isolate the memory cells from potentially damaging electrical energy that can be imposed during a precharge phase that precedes programming of the memory cells. Additionally, the improved circuitry and methods can operate to ensure that programming of the memory cells is performed in a controlled manner using only a program current.

The improved circuitry and methods are particularly useful for programming non-volatile memory cells. In one embodiment, the memory device pertains to a semiconductor memory product, such as a semiconductor memory chip or a portable memory card.

Embodiments of this aspect of the invention are discussed below with reference to FIGS. 1-5. However, those skilled in the art will readily appreciate that the detailed description given herein with respect to these figures is for explanatory purposes as the invention extends beyond these limited embodiments.

Figure 1:
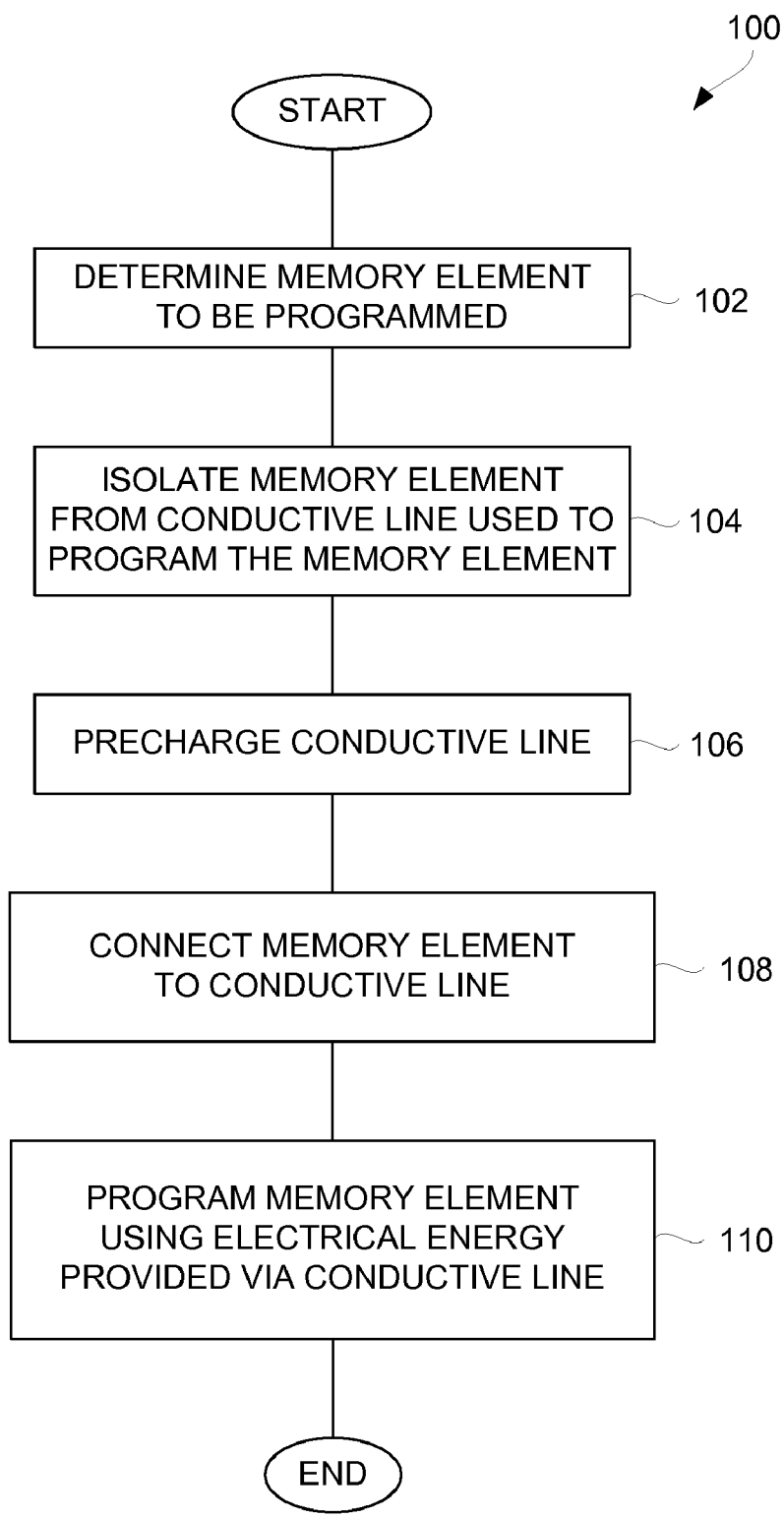
FIG. 1 is a flow diagram of a memory device programming process according to one embodiment of the invention.

FIG. 1 is a flow diagram of a memory device programming process 100 according to one embodiment of the invention. The memory device being programmed includes a plurality of memory elements, such as memory cells. Typically, the memory elements are arranged in an array.

The memory device programming process 100 initially determines 102 a memory element to be programmed. Typically, the memory element to be programmed is a non-volatile memory element that can be programmed or written to store an electrical characteristic representing a digital value. After the memory element to be programmed has been determined 102, the memory element is isolated 104 from a conductive line that is used to program the memory element. The conductive line is an electrical conductor provided within the memory device that is utilized to select the particular memory element to be programmed. The conductive line can, for example, be a decoded line or some other conductive line used in selecting memory elements to be programmed.

Next, the conductive line is precharged 106. Here, the conductive line is precharged while the memory element is isolated 104 from the conductive line. Typically, the conductive line has a significant amount of capacitance that delays changes to the voltage potential on the conductive line. For example, when programming a memory element, a relatively high voltage is required to be provided on the conductive line. By precharging 106 the conductive line, the voltage potential for programming can be provided to the conductive line such that the conductive line can quickly reach the proper potential for programming prior to programming the memory element. Advantageously, the conductive line can be precharged with a high current source so that the conductive line can reach the programming potential rapidly.

After the conductive line has been precharged 106, the memory element is connected 108 to the conductive line. Upon connecting 108 the memory element to the conductive line, the memory element begins to be programmed. Hence, following the connection 108 of the memory element to the conductive line, the memory element is programmed 110 using electrical energy provided via the conductive line. The electrical energy can be provided by a program current that is coupled to the conductive line. The program current is typically substantially smaller than the precharged current so that the programming of the memory element can be controlled with high precision and also so that damage to the memory element that would be potentially caused by the high precharge current can be prevented. After the memory element has been programmed 110, the memory device programming process 100 is complete and ends.

Figure 2:
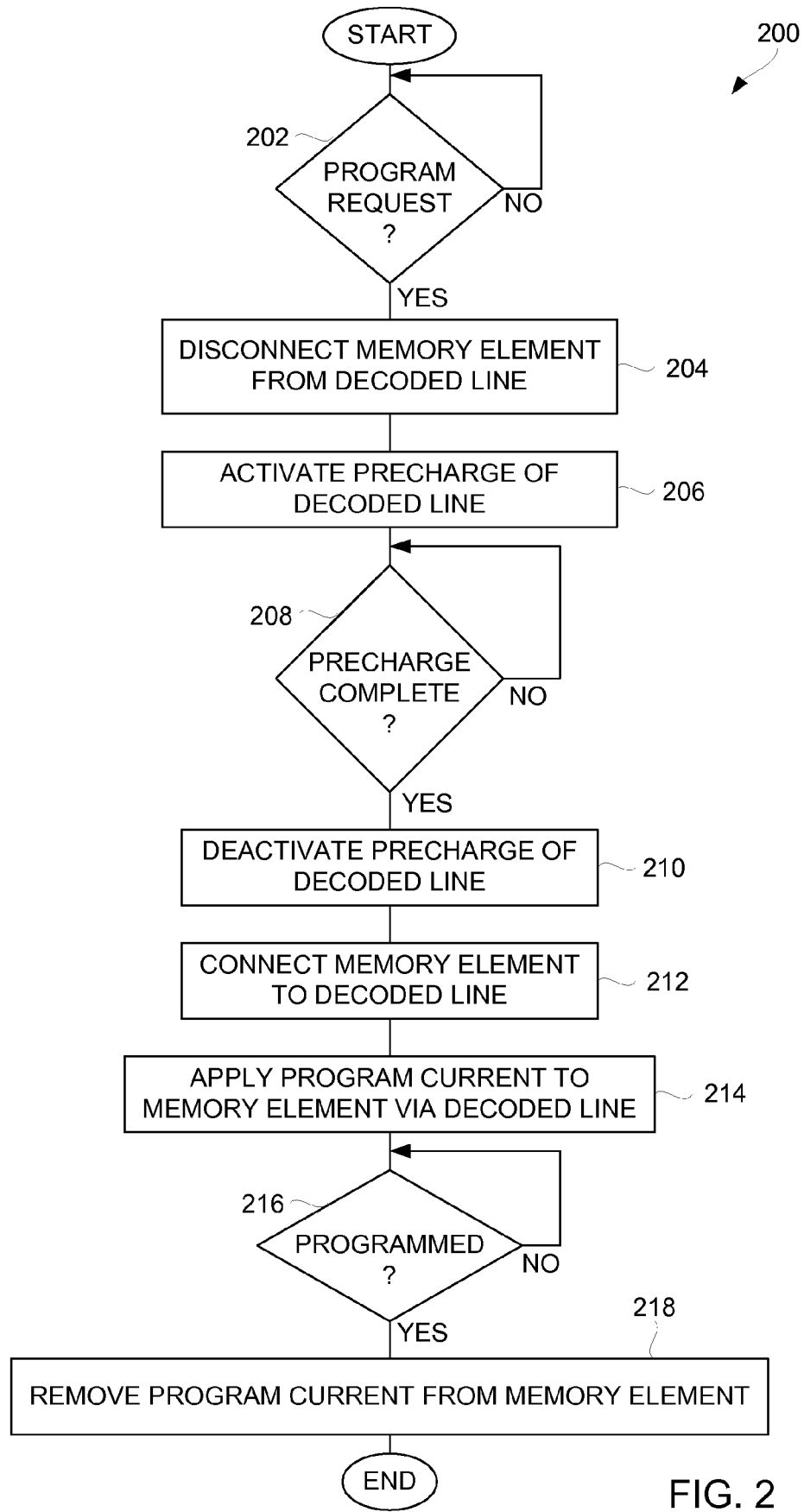
FIG. 2 is a flow diagram of a memory device programming process according to another embodiment of the invention.

FIG. 2 is a flow diagram of a memory device programming process 200 according to one embodiment of the invention. The memory device programming process 200 is, for example, suitable for use in programming a memory device having an array of memory elements.

The memory device programming process 200 begins with a decision 202 that determines whether a program request (or write request) has been received. When the decision 202 determines that a program request has not been received, the memory device programming process 200 awaits such a request. Alternatively, when the decision 202 determines that a program request has been received, the memory device programming process 200 continues. In other words, the memory device programming process 200 can be deemed invoked when a program request has been received.

Once the memory device programming process 200 continues, the memory element to be programmed is disconnected 204 from an associated decoded line that is to be utilized when programming the memory element. Next, precharge of the appropriate decoded line is activated 206. Typically, precharge of the decoded line is provided by a precharge current that is coupled to the decoded line when precharge of the decoded line is activated 206. As an example, the precharge current can be about 200-300 micro-Amperes ($\mu A$).

Next, a decision 208 determines whether precharge of the decoded line has completed. When the decision 208 determines that precharge of the decoded line has not completed, then the memory device programming process 200 awaits completion of the precharge. The determination of whether precharge of the decoded line has completed can be based on a monitoring the voltage on the decoded line or based on a predetermined period of time. On the other hand, once the decision 208 determines that precharge of the decoded line has completed, then precharge of the decoded line is deactivated 210. Here, precharge of the decoded line is discontinued because the decoded line has been fully precharged.

Once the precharge has been deactivated 210, the memory element is connected 212 to the decoded line. In one embodiment, the memory element is connected to the decoded line by way of a bitline selection path. After the memory element has been connected 212 to the decoded line, a program current is applied 214 to the memory element via the decoded line. As an example, the program current can be about 10-100 micro-Amperes (μA). By applying the program current to the memory element, the memory element can be programmed. In one implementation, while the memory element is being programmed through use of the program current, the memory element can be monitored to determine when the programming has completed. In this regard, a decision 216 determines whether the memory element has been programmed. In one example, examination of the amount of the supplied program current that flows through the memory element can serve as an indication of whether the memory element has been programmed. In another implementation, the memory element can be programmed using a program current having programming pulses of a fixed duration. In such case, the decision 216 can determine that the memory element has been programmed when the programming pulses of the fixed duration have been applied.

When the decision 216 determines that the memory element has not yet been programmed, the memory device programming process 200 continues programming the memory device until the memory device has been programmed through application of the program current. Once the decision 216 determines that the memory element has been programmed, the program current is removed 218 from the memory element. Following the block 218, the memory device programming process 200 ends.

The memory device being programmed includes a plurality of memory elements, such as memory cells. The memory elements can be non-volatile memory elements. In one embodiment, the memory elements are antifuse-type non-volatile memory elements which each have a diode and an antifuse. When the anti-fuse-type memory elements are programmed, they operate to "pop" or "blow" their antifuse structure. Although the antifuse-type of non-volatile memory element may only be programmed once, other non-volatile memories can be programmed multiple times (e.g., re-writable). For example, one example of a re-writable memory element includes a diode and a re-writable element (e.g., metal oxides or chalcogenides). Typically, the memory elements are arranged in an array. In one embodiment, the memory elements can have a three-dimensional configuration in the array.

The memory element being programmed can relate to a non-volatile memory cell (i.e., a memory cell whose data is not lost or altered when electrical power is removed). Although any suitable memory array can be used, in one embodiment, the memory cell is part of a three-dimensional memory array, which can provide economies in terms of reduced size and associated reductions in manufacturing cost. In one implementation, the memory array can include a vertical array of layers as memory cells (e.g., layers stacked vertically above one another on a single chip). The memory array can be part of a compact, modular memory device used with portable consumer electronic products. In one embodiment, the memory cell is field-programmable. A field-programmable memory cell is a memory cell that is fabricated in an initial, un-programmed digital state and can be switched to an alternative, programmed digital state at a time after fabrication. Although any suitable type of memory cell can be used, in one embodiment, the memory cell is a write-once memory cell comprising an antifuse and a diode, for example as described in U.S. Pat. Nos. 6,034,882 and 6,515,888, both of which are hereby incorporated by reference. In its un-programmed state, the antifuse is intact, and the memory cell holds a Logic 1. When suitable voltages are applied to the appropriate wordline and bitline, the antifuse of the memory cell is blown, and the diode is connected between the wordline and the bitline. This places the memory cell in a programmed (Logic 0) state. Alternatively, the un-programmed state of the memory cell can be Logic 0, and the programmed state can be Logic 1. Memory cells that support multiple programmed states can also be used. Being write-once, the initial, un-programmed digital state cannot be restored once the memory cell is switched to the programmed digital state. Instead of being write-once, the memory cell can be write-many (re-writeable). Unlike the digital state of a write-once memory cell, the digital state of a write-many memory cell can be switched between "un-programmed" and "programmed" digital states. When referring to write-many memory cells, the un-programmed digital state refers to the digital state of the memory cell before a programming operation. Accordingly, the un-programmed digital state can refer to either Logic 0 or Logic 1 (in a two-state memory cell) and does not necessarily refer to the digital state in which that memory cell was fabricated.

Figure 3:
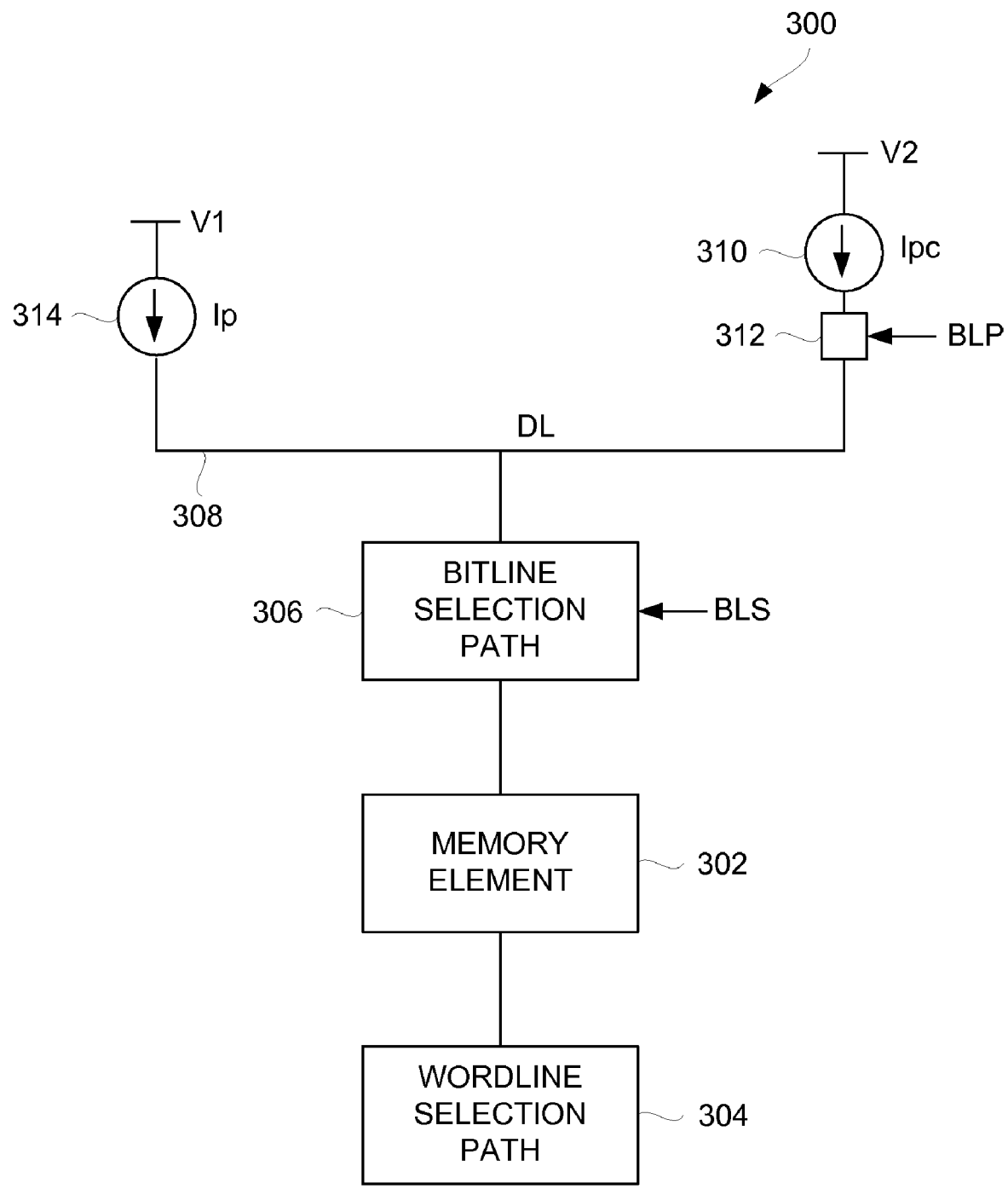
FIG. 3 is a block diagram of a memory programming system according to one embodiment of the invention.

FIG. 3 is a block diagram of a memory programming system 300 according to one embodiment of the invention. The memory programming system 300 includes a memory element 302. The memory element 302 is a representative memory element of numerous memory elements provided within an array of memory elements. The memory element 302 is selected or accessed by a wordline selection path 304 and a bitline selection path 306. The bitline selection path 306 couples between the memory element 302 and a decoded line (DL) 308. The decoded line 308 represents one of numerous decoded lines provided within the array of media elements. The decoded line 308 typically is capable of being coupled to a large number of the memory elements within the array of memory elements, though only a single memory element is depicted in FIG. 3. As a result, the decoded line 308 has a significant amount of capacitance associated with it. Consequently, prior to performing a program operation (or write operation), a precharge phase is utilized in order to raise the voltage potential at the decoded line 308 to the appropriate level for programming. As one example, the programming voltage could be about nine (9) Volts. In this regard, the memory programming system 300 includes a precharge current (Ipc) source 310 coupled to a voltage potential V2 which provides the precharge voltage. The precharge current (Ipc) source 310 controllably couples to the decoded line 308 through a switch 312. The switch 312 allows the precharge current (Ipc) to be either coupled to the decoded line 308 or decoupled from the decoded line 308. The switch 312 is controlled by a bitline precharge (BLP) signal. Here, the bitline selection path 306 is controlled by a bitline selection (BLS) signal such that the memory element 302 is isolated from the decoded line 308 during precharge of the decoded line 308. During the precharge phase, the bitline selection path 306 would be controlled by the bitline selection (BLS) signal to disconnect the memory element 302 from the decoded line 308.

Then, once the decoded line 308 has been precharged, the bitline precharge (BLP) signal would cause the precharge current source 310 to be disconnected from the decoded line 308. At this point, a program current (Ip) source 314 would provide a program current (Ip) to the decoded line 308. The program current (Ip) source 314 is coupled to a voltage potential V1 which represents a program voltage. The program current (Ip) would then be coupled to the memory element 302 by way of the bitline selection path 306. Here, the bitline selection path 306 would be controlled by the bitline selection (BLS) signal to couple the decoded line 308 to the memory element 302. Once the memory element has been programmed, the program current (Ip) can be decoupled from the memory element. Although the voltages V1 and V2 can be different, in one embodiment, they are the same.

Figure 4:
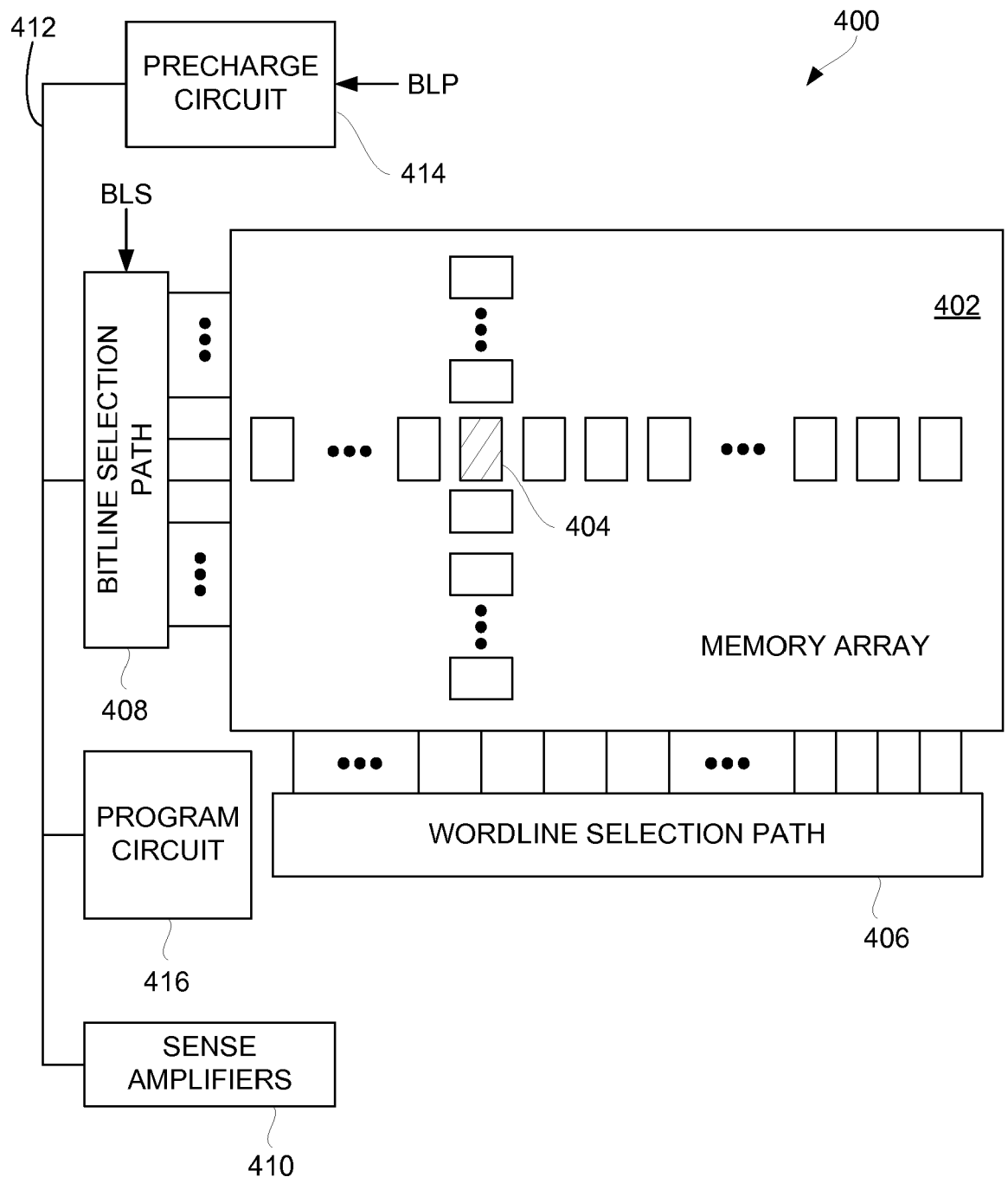
FIG. 4 is a block diagram of a memory programming system according to another embodiment of the invention.

FIG. 4 is a block diagram of a memory programming system 400 according to one embodiment of the invention. The memory programming system 400 represents one implementation for the memory program system 300 illustrated in FIG. 3.

The memory programming system 400 includes a memory array 402 that includes a plurality of memory cells (memory elements). A particular memory cell 404 to be programmed can be accessed by a wordline selection path 406 in combination with a bitline selection path 408. One or more sense amplifiers 410 can be coupled to a particular decoded line 412 to allow the memory cells to be programmed, read, or otherwise accessed. The bitline selection path 408 can couple to a plurality of bitlines, one or more of which can connect with the particular decoded line 412 illustrated in FIG. 4. The decoded line 412 is coupled to not only the bitline selection path 408 but also a precharge circuit 414 and a program circuit 416. The precharge circuit 414 is selectively controlled by a bitline precharge (BLP) signal to provide precharging of the decoded line 412 prior to programming the particular memory cell 404. During precharge, the precharge circuit 414 provides (e.g., couples) a precharge current (and precharge voltage) to the decoded line 412. Once precharge ends, the precharge current (and precharge voltage) are no longer provided (e.g., coupled) to the decoded line 412. Following the precharge by the precharge circuit 414, the program circuit 416 provides a program current (and program voltage) to the decoded line 412 so that the identified memory cell 404 can be programmed through use of the program current.

Figure 5:
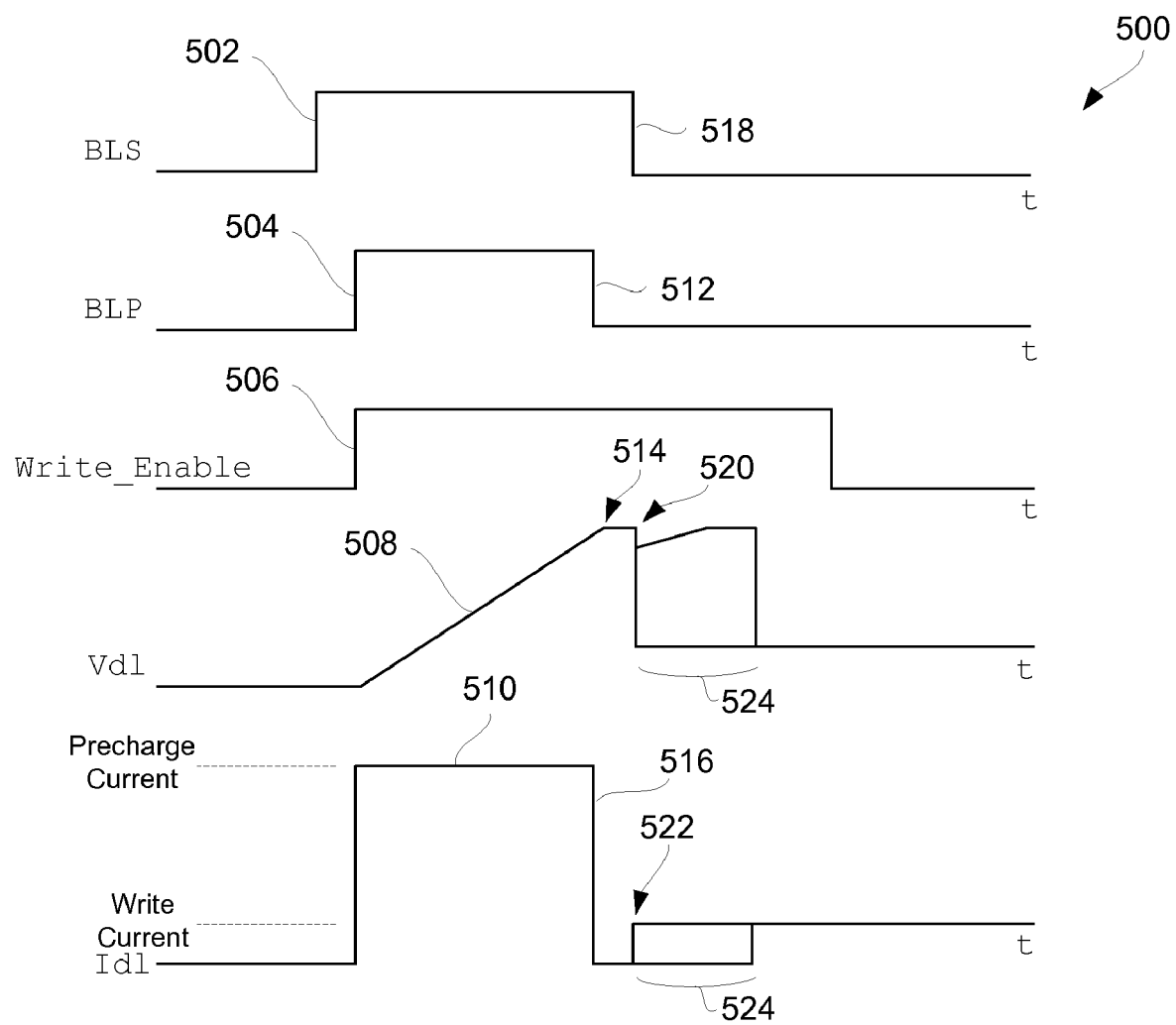
FIG. 5 is a timing diagram according to one embodiment of the invention.

FIG. 5 is a timing diagram 500 according to one embodiment of the invention. The timing diagram illustrated in FIG. 5 concerns programming a memory element. For example, the memory element can represent the memory element 302 illustrated in FIG. 3 or the memory element 404 illustrated in FIG. 4. The timing diagram can, for example, implement the memory device programming process 200 illustrated in FIG. 2.

A bitline selection (BLS) signal controls whether the memory element is coupled or decoupled to a particular decoded line being used to access a memory element to be programmed. The BLS signal disconnects the memory element from the particular decoded line at transition 502. Then, a bitline precharge (BLP) signal starts precharging the decoded line at transition 504. For example, at the transition 504, the BLP signal can start precharging the particular decoded line by coupling to a precharge current source (and a precharge voltage). Also, programming of one or more memory cells can be enabled at transition 506 of a write enable (WRITE_ENABLE) signal. Following the transition 504 of the BLP signal, the voltage (Vdl) of the particular decoded line increases in accordance with a ramp 508 which represents precharging of the decoded line having significant capacitance. At transition 512 of the BLP signal, the precharging of the decoded line stops. The precharging of the decoded line can be monitored to determine when it has reached the desired voltage level or the precharging duration can be empirically determined. Regardless, when precharge of the decoded line ends, the voltage (Vdl) on the decoded line is at a program voltage level at point 514.

Additionally, during precharge, a current (Idl) applied to the decoded line is at a precharge current level 510 during the precharge phase. The memory is, however, disconnected from the decoded line during precharge so that the current (Idl) does not couple to the memory element. However, when the transition 512 of the BLP signal causes the precharge process to end, the current (Idl) transitions 516 to having essentially no current being applied to the memory element.

Then, at transition 518 of the BLS signal, the memory element is connected to the precharged decoded line. At this point, the voltage (Vdl) on the decoded line (decoded line voltage) drops slightly at point 520 due to the capacitance of the bitline selection path now coupled to the decoded line. The memory element is then programmed by the voltage (Vdl) on the bitline (e.g., program voltage) and a program current 522 (write current) is supplied to the bitline. The amount of the program current 522 that passes through the memory element is dependent on the degree of the programming of the memory element. Although the voltage (Vdl) on the decoded line is provided across the memory element to be programmed, until the memory element is programmed, the current through the memory element is essentially zero. Once the memory element is programmed, the memory element conducts the current up to the limit set by the program current (write current).

For various reasons, there is a distribution of different program times for memory elements (e.g., antifuse-type non-volatile memory cells). Some memory elements are quick to become programmed, while others are slower to program. A program window 524 is shown in FIG. 5 correlated to the voltage (Vdl) and the current (Idl). Memory elements quicker to become programmed are represented towards the left of the program window 524, which means such memory elements are earlier to conduct the program current and earlier to reduce the voltage (Vdl). On the other hand, memory elements slower to program are represented towards the right of the program window 524, which means such memory elements are slower to conduct the program current and slower to reduce the voltage (Vdl).

The invention can be used with two-terminal memory cells. Two-terminal memory cells, for example, can be formed from polysilicon diodes, transition metal oxide (e.g., NiO) memory elements, and chalcogenide-based memory elements. Two-terminal memory arrays can be formed in a compact manner when arranged into cross-point memory arrays. Additional details on some two-terminal memory cells are provided in the following papers which are hereby incorporated herein by reference: (i) Pirovano et al., "Electronic Switching in Phase-Change Memories," IEEE Transactions on Electronic Devices, Vol. 51, No. 3, March 2003; (ii) Baek et al., "Multi-layer Cross-point Binary Oxide Resistive Memory (OxR-RAM) for Post-NAND Storage Application," IEEE International Electron Devices Meeting, IEEE, 2005; (iii) Baek et al., "Highly Scalable Non-volatile Resistive Memory using Simple Binary Oxide Driven by Asymmetric Unipolar Voltage Pulses," IEEE International Electron Devices Meeting, IEEE 2004; and (iv) Hwang et al., "Writing Current Reduction for High-density Phase-change RAM," IEEE International Electron Devices Meeting, IEEE, 2003. Additional details are also provided in U.S. Pat. No. 6,891,748, which is hereby incorporated herein by reference.

Additional information on detecting whether a memory cell being programmed is in a programmed state are provided in U.S. Pat. No. 6,574,145, which is hereby incorporated herein by reference. For additional information on current protection of memory elements, see (i) U.S. patent application Ser. No. 11/552,441, filed Oct. 24, 2006, and entitled "METHOD FOR PROTECTING MEMORY CELLS DURING PROGRAMMING", which is hereby incorporated herein by reference; and (ii) U.S. patent application Ser. No. 11/552,426, filed Oct. 24, 2006, and entitled "MEMORY DEVICE FOR PROTECTING MEMORY CELLS DURING PROGRAMMING", which is hereby incorporated herein by reference.

The invention is suitable for use with both single-level (binary) memories and multi-level (multi-state) memories. In multi-level memories, each data storage element stores two or more bits of data. In one embodiment, through accurate current control, different values of programming currents can be used to program the different levels in multi-level memories.

The various features, aspects, embodiments or implementations can be used alone or in any combination.

The invention can further pertain to an electronic system that includes a memory system as discussed above. A memory system is a system that includes at least a memory device that provides data storage. Memory systems (i.e., memory cards) are commonly used to store digital data for use with various electronics products. The memory system is often removable from the electronic system so the stored digital data is portable. The memory systems according to the invention can have a relatively small form factor and be used to store digital data for electronics products (e.g., consumer electronic products) that acquire data, such as cameras, hand-held or notebook computers, network cards, network appliances, set-top boxes, hand-held or other small media (e.g., audio) players/recorders (e.g., MP3 devices), personal digital assistants, mobile telephones, and medical monitors.

The advantages of the invention are numerous. Different embodiments or implementations may yield one or more of the following advantages. One advantage of the invention is that memory elements to be programmed can be rapidly precharged, without undesirably damaging or programming the memory elements during such precharging. Another advantage of the invention is that memory elements can be isolated during a precharge phase. Still another advantage of the invention is that a program current used to program memory elements can be accurately controlled during programming.

The many features and advantages of the present invention are apparent from the written description. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory device comprising:
    a memory array including a plurality of memory cells; and
    a program control circuit operative to apply a precharge current to precharge a conductive line used to program a memory cell while the memory cell is isolated from the conductive line, and then following precharge of the conductive line, applying a program current to the conductive line so as to program the memory cell,
    whereby the programming of the memory cell is performed in accordance with the program current, whereas the precharge of the conductive line is performed in accordance with the precharge current, where the precharge current is greater than the program current.

2. A memory device as recited in claim 1, wherein the program current is less than one-half of the precharge current.

3. A memory device as recited in claim 1, wherein the program current is 10-100 micro-Amperes ($\mu A$) and the precharge current is 200-300 $\mu A$.

4. A method as recited in claim 1, wherein said memory device further comprises:
    a detection circuit operative to detect, while the memory cell within the memory array is being programmed, when the memory cell becomes programmed.

5. A method as recited in claim 1, wherein said memory array arranges the memory cells in a plurality of layers of memory cells stacked vertically above one another in a single chip.

6. A memory device as recited in claim 1, wherein the memory cells are non-volatile memory elements.

7. A memory device as recited in claim 1, wherein the memory cells are diode-based memory elements.

8. A memory device as recited in claim 7, wherein each of the diode-based memory elements comprises a diode and an antifuse device.

9. A memory device as recited in claim 7, wherein each of the diode-based memory elements comprises a diode and a re-writable element.

10. A memory device of claim 1, wherein the memory cell comprises a write-once memory cell.

11. A memory device of claim 1, wherein the memory cell comprises a write-many memory cell.

12. A memory device of claim 1, wherein the memory cell comprises a field-programmable memory cell.

13. A memory device as recited in claim 1, wherein the memory cells are two-terminal non-volatile memory elements.

14. An electronic system, comprising:
    a data acquisition device; and
    a data storage device removably coupled to said data acquisition device, said data storage device storing data acquired by said data acquisition device, and said data storage device including at least:
        a memory array including a plurality of data storage elements; and
        a program control circuit operative to apply a precharge current to precharge a conductive line used to program a data storage element while the data storage element is isolated from the conductive line, and then following precharge of the conductive line, applying a program current to the conductive line so as to program the data storage element,
    whereby the programming of the data storage element is performed in accordance with the program current, whereas the precharge of the conductive line is performed in accordance with the precharge current, where the precharge current is greater than the program current.

15. An electronic system as recited in claim 14, wherein said program control circuit detects that the data storage element is in the programmed state based on a current level through the data storage element during programming.

16. An electronic system as recited in claim 14, wherein during programming, the data storage element is only subjected to at most the program current.

17. An electronic system as recited in claim 14,
    wherein the data storage elements are non-volatile memory elements, and
    wherein said array of data storage elements includes a plurality of layers of memory cells stacked vertically above one another in a single chip.

18. An electronic system as recited in claim 17, wherein the non-volatile memory elements are diode-based memory elements.

19. An electronic system as recited in claim 17, wherein the non-volatile memory elements are two-terminal memory elements.

20. An electronic system as recited in claim 14, wherein said data acquisition device is one of a camera, a network card or appliance, a hand-held or notebook computer, a set-top box, a hand-held or other small media player/recorder, and a medical monitor.

* * * * *